(12) United States Patent
Shih et al.

(10) Patent No.: US 9,431,598 B2
(45) Date of Patent: Aug. 30, 2016

(54) SOL-GEL PRECURSORS AND METHODS FOR MAKING LEAD-BASED PEROVSKITE FILMS

(75) Inventors: Wei-Heng Shih, Bryn Mawr, PA (US);
Wan Y. Shih, Bryn Mawr, PA (US);
Zuyan Shen, Philadelphia, PA (US);
Huidong Li, Newark, DE (US);
Xiaotong Gao, Philadelphia, PA (US)

(73) Assignee: Drexel University, Philadelphia, PA (US)

(*) Notice: Subject to any disclaimer, the term of this patent is extended or adjusted under 35 U.S.C. 154(b) by 1968 days.

(21) Appl. No.: 12/513,308

(22) PCT Filed: Nov. 6, 2007

(86) PCT No.: PCT/US2007/083767
§ 371 (c)(1),
(2), (4) Date: May 1, 2009

(87) PCT Pub. No.: WO2008/058121
PCT Pub. Date: May 15, 2008

(65) Prior Publication Data
US 2010/0051447 A1 Mar. 4, 2010

Related U.S. Application Data

(60) Provisional application No. 60/864,470, filed on Nov. 6, 2006.

(51) Int. Cl.
*H01L 41/00* (2013.01)
*H01L 41/318* (2013.01)
*H01L 41/187* (2006.01)
*H01L 41/09* (2006.01)

(52) U.S. Cl.
CPC ......... *H01L 41/318* (2013.01); *H01L 41/0973* (2013.01); *H01L 41/1875* (2013.01)

(58) Field of Classification Search
USPC .......................................... 427/226
See application file for complete search history.

(56) References Cited

U.S. PATENT DOCUMENTS

| | | | |
|---|---|---|---|
| 4,756,147 A | | 7/1988 | Savell |
| 5,423,285 A | * | 6/1995 | Paz de Araujo et al. ...... 117/90 |
| 5,536,963 A | | 7/1996 | Polla |
| 5,585,136 A | * | 12/1996 | Barrow et al. ............... 427/2.24 |
| 5,756,147 A | * | 5/1998 | Wu et al. ........................ 427/66 |
| 6,066,581 A | * | 5/2000 | Chivukula et al. ............. 501/12 |
| 6,337,032 B1 | | 1/2002 | Chivukula et al. |
| 6,465,260 B1 | | 10/2002 | Hong et al. |
| 6,523,943 B1 | | 2/2003 | Fukui |

(Continued)

OTHER PUBLICATIONS

Udayakumar, et al., "Thickness-Dependant Electrical Characteristics of Lead Zirconate Titanate Thin Films", J. Appl. Phys. 77 (8), Apr. 15, 1995, pp. 3981-3986.

(Continued)

*Primary Examiner* — Robert Vetere
(74) *Attorney, Agent, or Firm* — Mendelsohn Dunleavy, P.C.

(57) ABSTRACT

A simple, economical sol-gel method was invented to produce thick and dense lead zirconate titanate (PZT) thin films that exhibit the stoichiometric chemical composition and unprecedented electrical and dielectric properties. The PZT films are the foundation of many microelectromechanical systems (MEMS) and nanoelectromechanical systems (NEMS) for micro/nano sensors and actuators applications.

2 Claims, 10 Drawing Sheets

(56) References Cited

U.S. PATENT DOCUMENTS

| | | | |
|---|---|---|---|
| 6,841,192 B2 | 1/2005 | Hashimoto et al. | |
| 2002/0003247 A1* | 1/2002 | Yokoyama et al. | 257/296 |
| 2005/0128675 A1* | 6/2005 | Wang et al. | 361/271 |
| 2005/0146838 A1* | 7/2005 | Shioga et al. | 361/306.3 |

OTHER PUBLICATIONS

Kwok, et al., "Low Temperature Perovskite Formation of Lead Zirconate Titanate Thin Films by a Seeding Process", J. Mater. Res., vol. 8, No. 2, Feb. 1993, pp. 339-344.

Amanuma, et al., "Crystallization Behavior of Sol-Gel Derived Pb(Zr, Ti) 03 Thin Films and the Polarization Switching Effect on Film Microstructure", Appl. Phys. Lett. 65 (24), Dec. 12, 1994, pp. 3140-3142.

Birnie, et al., "Coating Uniformity and Device Applicability of Spin Coated Sol-Gel PZT Films", Microelectronic Engineering 29 (1995), pp. 189-192.

Tu, et al., "A Study of the Effects of Process Variables on the Properties of PZT Films Produced by a Single-Layer Sol-Gel Technique", Journal of Materials Science, 30, (1995), pp. 2507-2516.

Maki, et al., "Evaluation of Pb(Zr, Ti)O3 Films Derived from Propylene-Glycol-Based Sol-Gel Solutions" Jpn. J. Appl. Phys. vol. 39 (2000) pp. 5421-5425.

Luo, Hongyu, "Colloidal Processing of PMN-PT Thick Films for Piezoelectric Sensor Applications" A Thesis Submitted to the Faculty of Drexel University, Jun. 2005, 186 pages.

Zhu, et al., "Mechanism of Flexural Resonance Frequency Shift of a Piezoelectric Microcantilever Sensor During Humidity Detection", Applied Physics Letters, 92, 2008, pp. 183505-1 to 183505-3.

Shih, et al., "Nanosensors for Environmental Applications", Nanotechnologies for the Life Sciences, vol. 5, 2006, pp. 271-293.

Zhao, et al., "Critical Thickness for Cracking of Pb(Zr 0.53 Ti 0.47)O3 Thin Films Deposited on Pt/Ti/Si(100) Substrates", Acta Materialia, 50, (2002), pp. 4241-4254.

McGovern, et al., "In Situ Detection of Bacillus anthracis Spores using Fully Submersible, Self-Exciting, Self-Sensing PMN-PT/SN Piezoelectric Microcantilevers", Analy PZT50 (0.9 μm)

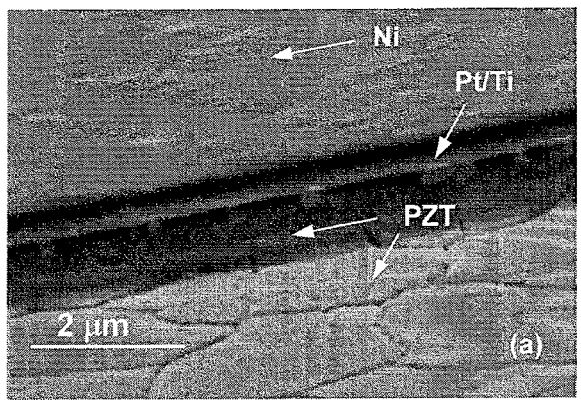
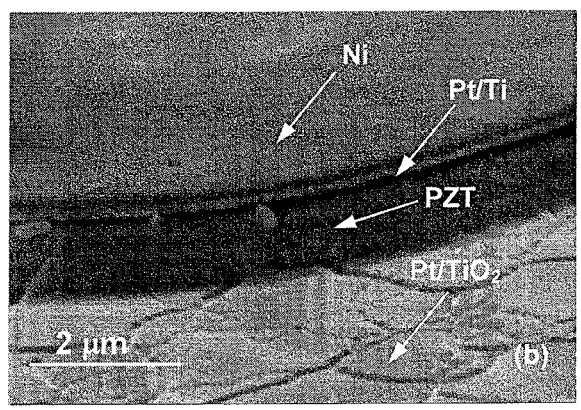
Figures 6(a)-6(b)
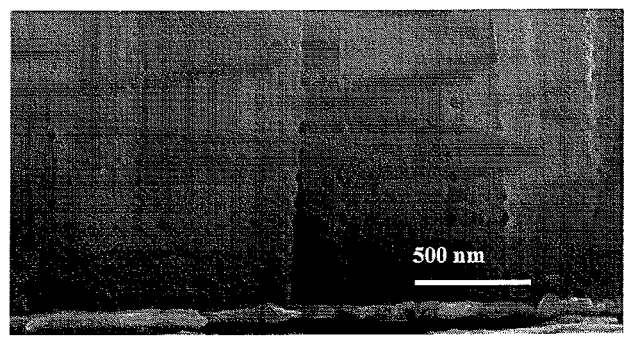
Figure 7

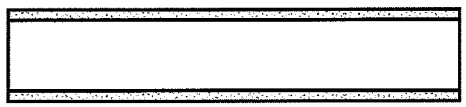
(A) GROW SiO₂ LAYER BY THERMAL OXIDATION ON Si WAFER

(B) DEPOSIT TiOx/Pt BOTTOM ELECTRODE BY REACTIVE SPUTTERING

(C) DEPOSIT PZT THIN FILM ON Si/SiO₂/TiOx/Pt SUBSTRATE

(D) DEPOSIT TOP ELECTRODE AND Ni LAYER ON PZT

(E) ETCH AND PATTERN PZT BY CHLORINE BASED ICP

(F) ETCH AND PATTERN TiOx/Pt BY CHLORINE BASED ICP

(G) DEPOSIT AND PATTERN Au BONDING PAD ON ELECTRODE

(H) ETCH Si FROM BACK SIDE BY KOH

(I) ETCH SiO₂ FROM THE FRONT SIDE BY RIE TO RELEASE CANTILEVER

 Si   Au   TiO₂/Pt   PZT   TOP ELECTRODE   SiO₂

FIG..10

SOL-GEL PRECURSORS AND METHODS FOR MAKING LEAD-BASED PEROVSKITE FILMS

RELATED APPLICATION DATA

This application claims the benefit of U.S. provisional application No. 60/864,470, filed on Nov. 6, 2006, pursuant to 35 U.S.C. §119(e).

STATEMENT OF GOVERNMENT INTEREST

This invention was reduced to practice with Government support under Grant No. R01 EB000720 awarded by the National Institutes of Health; the Government is therefore entitled to certain rights in this invention.

BACKGROUND OF THE INVENTION

1. Field of the Invention

The present invention relates to sol-gel precursors for the production of lead-based perovskites such as lead zirconate titanate (PZT) as well as methods for making lead-based perovskite films.

2. Brief Description of the Prior Art

In recent years, piezoelectric micro-electro-mechanical systems (MEMS) have seen rapid growth in micro-actuators and sensor applications. For MEMS, a piezoelectric thin film must be deposited on a silicon substrate and integrated in the silicon-based micro-fabrication process. The current material of choice for the piezoelectric thin film is lead zirconate titanate (PZT) because of its high dielectric constant and piezoelectric coefficients. Although the dielectric constant of bulk commercial PZT can be over 3000 and its $d_{33}$ piezoelectric coefficient over 600 pm/V, about two orders of magnitude higher than those of commonly used quartz and ZnO, most PZT films only exhibit a dielectric constant of 800-1500, and a piezoelectric coefficient, $d_{33}$=190-250 pm/V, 20 to 40% of the $d_{33}$ of the bulk commercial PZT. This is primarily due to thin-film related problems such as the interfacial diffusion/reaction, substrate pinning, and lack of control over film stoichiometry.

Compared with vacuum-based vapor deposition methods such as pulsed laser ablation, electron-beam evaporation, ion-beam deposition, radio-frequency (RF) planar magnetron sputtering, and metallorganic chemical vapor deposition (MOCVD), the solution-based sol-gel method is advantageous in terms of simplicity, economy, and the ease with which the composition can be controlled. The main difficulty of the sol-gel method, however, is lead loss during the repeated heat treatments required by the method.

In addition, cracking of the coating after heat treatment may limit the film thickness that can be achieved using sol-gel methods. Although viscous additives such as polyvinylpyrrolidone (PVP) can increase the film thickness they tend to degrade the film properties.

In order to make thick lead-based ferroelectric/piezoelectric films without the need for viscous additives, a precursor solution that has the right viscosity for film rigidity during sintering is required. In addition, both lead loss and interfacial reactions can change the film stoichiometry and degrade the film properties.

U.S. Pat. No. 5,536,963 discloses the preparation of a perovskite lead zirconium titanate ("PZT") piezoelectric layer by sol-gel deposition techniques involving sequential deposition and curing of a plurality of PZT layers.

U.S. Pat. No. 6,523,943 also discloses the preparation of a perovskite PZT piezoelectric layer by sol-gel deposition techniques involving sequential deposition and curing of a plurality of PZT layers. Suitable solvents are combinations of polar and non-polar solvents. Alcohols such as ethylene glycol and amides are mentioned as potentially useful polar solvents Non-polar solvents include toluene, hexane, cyclohexane and acetonitrile.

U.S. Pat. No. 5,585,136 also discloses the preparation of a perovskite PZT piezoelectric layer by sol-gel deposition techniques involving sequential deposition and curing of a plurality of PZT layers. A mixture of polyethylene glycol and glycerol was employed as the solvent in Example 1 to provide a PZT film.

U.S. Pat. No. 4,756,147 discloses the preparation of a perovskite PZT layer using a sol-gel process wherein lead acetate is dissolved in dehydrated acetic acid, zirconium piopoxide and titanium isopropoxide are added and a mixture of ethylene glycol and propanol was added to form a stable sol. Additional ethylene glycol is added to adjust the viscosity of the solution.

Therefore, to obtain superior dielectric, ferroelectric, and piezoelectric properties the present invention controls the viscosity of the precursor solution and/or the composition of the precursor to provide the desired film stoichiometry after multiple heat treatments.

One object of certain embodiments of the invention is to develop a new sol-gel precursor for lead-based perovskite thin films on a silicon-based substrate with superior dielectric and piezoelectric properties for various dielectric, ferroelectric, and electromechanical systems (MEMS), as well as for micro-sensor applications.

One solution offered by certain embodiments of the invention is a sol-gel process that allows deposition of thick lead-based ferroelectric/piezoelectric films with superior dielectric, ferroelectric properties and without the need for viscous additives which may adversely affect film properties or performance.

SUMMARY OF THE INVENTION

In one aspect, the present invention relates to a method for producing a lead-containing perovskite film. In the method, lead acetate and other film components are dissolved in a suitable solvent to provide a precursor solution. The precursor solution is then deposited on a substrate, pyrolyzed and annealed. The deposition, pyrolysis and annealing steps are repeated to obtain a desired film thickness. In the method, sufficient lead is employed to provide a 25-75 mole percent stoichiometric excess of lead, relative to a stoichiometric amount of lead required to react with said other film components for form said perovskite film.

BRIEF DESCRIPTION OF THE DRAWINGS

FIG. 6(a) shows an SEM micrograph of a partially-etched PZT50 surface.

FIG. 6(b) shows an SEM micrograph of the platinum bottom electrode surface after etching.

FIG. 7 shows an SEM micrograph of a cross-section of the PZT film made with lead acetate aged for 19 days.

FIG. 10 shows a method for fabricating piezoelectric cantilevers using the sol-gel process of the present invention.

DETAILED DESCRIPTION OF THE PREFERRED EMBODIMENTS

Figures 1A, 1B:
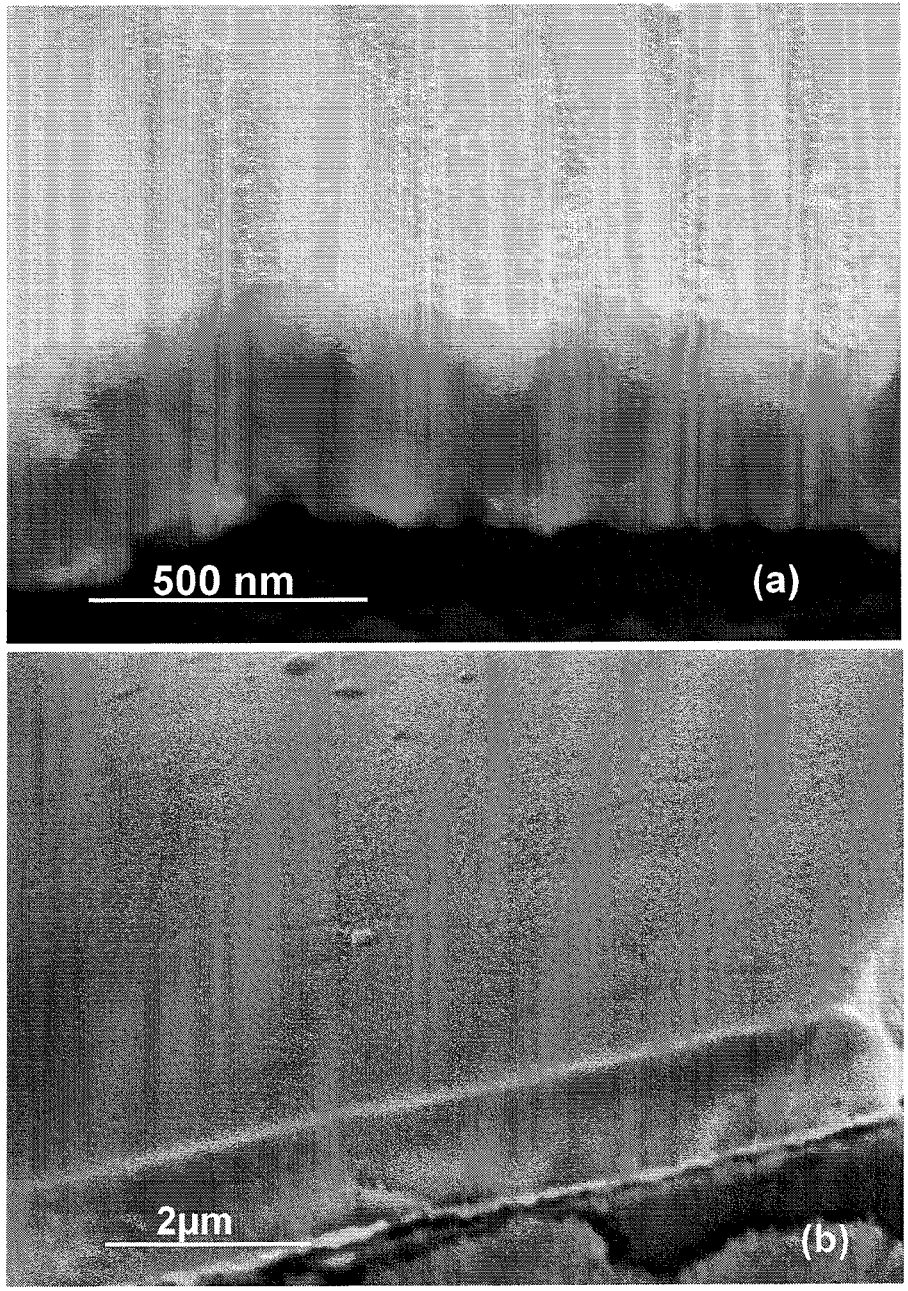
FIG. 1(a) shows an SEM micrograph of a 15-layer PZT15 film
FIG. 1(b) shows an SEM micrograph of a 50-layer PZT50 film.

The present invention controls the viscosity of the precursor solution and/or the composition of the precursor to provide the desired film stoichiometry after multiple heat treatments. In one aspect, the present invention provides a new sol-gel precursor for the making lead-based perovskite thin films on a silicon-based substrate with superior dielectric and piezoelectric properties for various dielectric, ferroelectric, and electromechanical systems (MEMS), as well as for micro-sensor applications. The present invention provides a sol-gel process that allows deposition of thick lead-based ferroelectric/piezoelectric films with superior dielectric, ferroelectric properties and without the need for viscous additives which may adversely affect film properties or performance.

In one aspect the present invention employs a stoichiometric excess of lead in the sol-gel process. More specifically, significantly more lead is provided to the sol-gel process that would be required for a stoichiometric reaction with other components of the perovskite films to form a lead-based film. In certain embodiments of the invention, 25-75 mole percent stoichiometric excess of lead relative to the stoichiometric amount of lead required for reaction with other components of the sol-gel precursor to form the perovskite film is employed. More preferably, 35-65 mole percent of lead more than the stoichiometric amount of lead required for the process is employed, and most preferably, 40-60 mole percent of lead more than the stoichiometric amount of lead required for the process, is employed. This results in films with the desired final stoichiometry to provide superior dielectric, ferroelectric, and piezoelectric properties after multiple heat treatments.

In another aspect, the present invention employs a solvent for the sol-gel precursor that provides a viscosity of about 5 mPa·s to about 30 mPa·s, mole preferably, about 10 mPa·s to about 20 mPa·s. For example, ethylene glycol may be used as a solvent for at least the lead precursor for the sol-gel process. Ethylene glycol offers a high viscosity of 18 mPa·s at 20° C., which is more than twenty times higher than other solvents such as acetic acid and 2-methoxyethanol used in conventional sol-gel syntheses. The sol-gel synthesis of the lead-based perovskite thin films may begin with the preparation of a lead precursor solution using, for example, ethylene glycol as the solvent. Other conventional solvents for sol-gel processes may also be employed and/or mixed with ethylene glycol, though ethylene glycol is the most preferred solvent for use in the present invention. Other suitable solvents include acetylacetone, 2-methoxyethanol, polyvinylpyrrolidone (PVP), Propyl alcohol and deionized water.

In another aspect, the present invention employs lead acetate that contains some lead carbonate therein to form the lead-containing precursor solution. The presence of lead carbonate in the precursor solution may reduce the tendency of thick films to crack during the deposition and heat treatment process.

One method for providing lead acetate containing some lead carbonate is to age lead acetate anhydrous, $(CH_3COO)_2Pb \cdot Pb(OH)_2$, in air for a sufficient time (which depends on the age of the bottle) to develop lead carbonate or hydrated lead acetate in the lead acetate anhydrous. A typical aging period may be about 19-24 days for a new bottle of lead acetate anhydrous. Optionally, the humidity of the air can be controlled during the aging process. Alternatively, lead acetate hydrates may be used as a starting material but generally it is desirable to remove the water from the lead acetate hydrate at some point during the process of preparing the lead-containing precursor in order to minimize the effect of the presence of the water on the composition and/or properties of the deposited perovskite films. The aging process provides control of the degree of cross-linking in the precursor solution to permit control of film density, and thickness to provide improved films.

Also, the present invention preferably employs a more stable lead acetate anhydrous, rather than lead acetate trihydrate to avoid the need for carrying out the difficult and time-consuming dehydration process needed when using lead acetate trihydrate as a starting material for preparation of the lead-containing precursor.

Precursors containing zirconium and titanium can be prepared in any suitable manner, using conventional solvents for the preparation of such precursors, Depending on the system, precursors containing titanium, zirconium or other components of the lead-based perovskite films may also be prepared using ethylene glycol as the solvent. For example, for $Pb(Zr_{0.52}Ti_{0.48})O_3$ thin films, titanium isopropoxide may be dissolved in ethylene glycol followed by the addition of lead acetate anhydrous aged in air for 19-24 days. A separate zirconium precursor solution may be prepared by dissolving zirconium-n-propoxide in 2-proponal. A final PZT precursor solution may then be obtained by mixing the zirconium precursor solution with the lead-titanium precursor solution.

The use of the ethylene glycol as the solvent results in a precursor solution that is much more viscous than similar solutions made with conventional solvents. The lead-containing precursor solution may then be spin-coated on, for example, a Si/SiO₂/TiO₂/Pt substrate. Alternatively, a $TiO_x$ layer can first be deposited by reactive sputtering of titanium in the presence of oxygen with the substrate heated to a temperature during said reactive sputtering step of about 550-750° C., more preferably, about 650° C. to result in titanium oxide in the rutile or anatase structure. Alternatively, the titanium oxide layer can be obtained by evaporating or sputtering titanium on the silicon oxide layer followed by thermal oxidation.

After every three consecutive coatings (or layers) of the lead-containing precursor, the film may be pyrolyzed at up to 400° C., more preferably, at about 350° C., and, optionally, for about 12 minutes, and annealed or heat-treated at about 650° C. for about 1-2 hours. The spin-coating and heat-treatment procedures may be repeated until the desired thickness is obtained.

The process may be carried out without the addition of Zr-precursor and then will result in the formation of $PbTiO_3$. Similarly, without the presence of Ti-precursor, $PbZrO_3$ thin films can be made. Other lead-based systems including $PbMgNbO_3$ (PMN), $PbZnNbO_3$ (PZN), $PbFeMnO_3$, $PbSnZrTiO_3$, $PbNiNbO_3$ (PNN), $PbCdNbO_3$ (PCN) and $PbFeMnO_3$, $PbFeWO_3$, $PbScTaO_3$ (PST), $PbSnZrTiO_3$, $PbLaZrTiO_3$ (PLZT), $PbBaZrTiO_3$, and $PbSrZrTiO_3$ may also be prepared in this manner.

Typical substrates used for lead-perovskite films including PZT films have the platinum deposited on a titanium bonding layer which is on either silicon oxide or silicon nitride, e.g., $Si/SiO_2/Ti/Pt$ or $Si/Si_3N_4/Ti/Pt$. Those substrates have been shown to result in defects such as pin holes and cracks in the platinum electrode. In comparison, depositing platinum with titanium oxide as the bonding layer on silicon oxide has been shown to provide a substrate that exhibits better thermal stability. The titanium oxide layer limited the diffusion of lead through the platinum electrode into the $Si_3N_4$ or $SiO_2$ layers and prevented the formation of lead silicates.

One characteristic of the lead-containing precursor solution of the present invention is that the turbidity of unfiltered precursor solution decreases with time, and, after filtering, the filtered solution exhibits a much lower turbidity that stays constant with time. Preferably, this filtered solution is used for deposition of the lead-containing perovskite layers. The various features of the present invention provide a lead and titanium precursor solution that has the right cross-linking properties and viscosity to form thick, dense and uniform films with a smooth surface.

The sol-gel methods of the present invention are advantageous in terms of simplicity, economy, and ease with which the composition can be controlled. The present invention addresses the drawbacks of current sol-gel methods which tend to have lead loss during repeated heat treatments as well as cracking after heat treatment that limits the film thickness. The sol-gel methods of the present invention also provide a significantly higher dielectric constant for the films than is typically obtained with current vapor deposition or solution deposition methods. For example, the present invention may provide an apparent dielectric constant 1900 and an intrinsic dielectric constant 2100.

The perovskite films of the present invention may be used to fabricate microelectromechanical systems (MEMS) and nanoelectromechanical systems (NEMS) for micro/nano sensors and actuator applications. For example, piezoelectric sensors for a variety of different applications may be made using the films of the present invention.

Examples 1-2

Varying the Lead Content of the Sol-Gel Precursor

For $Pb(Zr_{0.52}Ti_{0.48})O_3$ thin films, $8.46 \times 10^{-3}$ moles of titanium isopropoxide (≥97%, Alfa Aesar) were dissolved in 40 ml of ethylene glycol (≥99.5%, Alfa Aesar) under constant stirring followed by the addition of lead acetate anhydrous (Pb≥72 wt %, Fluka) aged in air for 19-24 days. A separate zirconium precursor solution was prepared by dissolving $9.54 \times 10^{-3}$ moles of zirconium-n-propoxide (≥70% in n-propanol, Alfa Aesar) in 20 ml of 2-proponal (≥99.5%, Aldrich). A final 0.3 M PZT precursor solution was obtained by mixing the zirconium precursor solution with the lead-titanium precursor solution followed by constant stirring for more than 24 hr. The nominal Zr/Ti molar ratio was 53/47.

To study the effect of excess lead on the PZT films, precursor solutions with 15 mol % and 50 mol % excess lead were prepared. In what follows, films made with 15 mol % and 50 mol % excess lead are referred to as PZT15 and PZT50, respectively. The use of the ethylene glycol as solvent made the precursor solution much more viscous in comparison with other conventional solvents typically used in sol-gel deposition processes for making perovskite films. The PZT precursor solution was spin-coated on a $Si/SiO_2/TiO_2/Pt$ substrate (150 nm Pt on 40 nm $TiO_2$ on 0.5 μm $SiO_2$ on a (100)-oriented silicon wafer) purchased from Radiant Technologies (Albuquerque, N. Mex.) initially at 1000 rpm for 10 sec followed by 4000 rpm for 30 sec. Alternatively, the $TiO_x$ layer can be deposited by reactive sputtering (Kurt Lesker Sparc-LE20 reactive sputtering system) of titanium in the presence of oxygen with the substrate heated to 650° C. After deposition of every three consecutive coatings or layers, the film was pyrolyzed at 350° C. for 12 min and heat-treated at 650° C. for 2 hr. The spin-coating and heat-treatment procedures were repeated until the film started to crack or a desired thickness was reached.

In this study, the substrate had a 150 m thick platinum bottom electrode with a 40 nm thick titanium oxide as the bonding layer on a 0.5-μm (or larger) thick $SiO_2$ layer on a (100) silicon wafer. With 50% nominal lead excess (PZT50) and with ethylene glycol as solvent for the lead-titanium precursor dense, uniform, single-phase, and stoichiometric films 1.6 μm in thickness were achieved with an average grain size larger than 2 μm. The apparent dielectric constant, saturation polarization, and remnant polarization for the PZT50 films were as high as 1600-1700, 55 μC/cm$^2$, and 30 μC/cm$^2$, respectively. In contrast, with 15% nominal lead excess (PZT15), the films were lead deficient, started cracking at 0.4 μm thickness, and showed an apparent dielectric constant, saturation polarization, and remnant polarization of 600, 32 μC/cm$^2$, and 18 μC/cm$^2$, respectively. The intrinsic dielectric constants, as deduced from the slope of the inverse capacitance versus film thickness, of the PZT50 films and PZT15 films were 2100 and 850, respectively.

With a 15%-lead excess precursor solution, only 15 layers could be deposited before the film cracked. On the other hand, using the 50%-lead excess precursor solution as many as 50 layers without cracks could be deposited. With 15%-lead excess, the precursor solution was clear and could easily pass through a 0.2-μm filter before spin coating. In contrast, the precursor solution with 50% lead excess appeared slightly cloudy and only 20% of the solution passed through a 0.2-μm filter, indicative that the 50%-lead excess solution was significantly more viscous than the 15%-lead excess solution.

FIGS. 1(a) and 1(b) show SEM micrographs of a 15-layer PZT15 film and of a 50-layer PZT50 film, respectively. As can be seen from FIGS. 1(a) and 1(b), the thickness of the 15-layer PZT15 film was about 0.4 μm, corresponding to 26 nm per layer and that of the 50-layer PZT50 film was about 1.6 μm, corresponding to about 32 nm per layer, consistent with the fact that the 50%-lead excess precursor solution was more viscous than the 15%-lead excess precursor solution. Besides the differences in layer thickness and tendency to crack, FIG. 1(*a*) and FIG. 1(*b*) show that the PZT50 film appears to be denser and smoother than the PZT15 film.

Figures 2A, 2B, 2C:
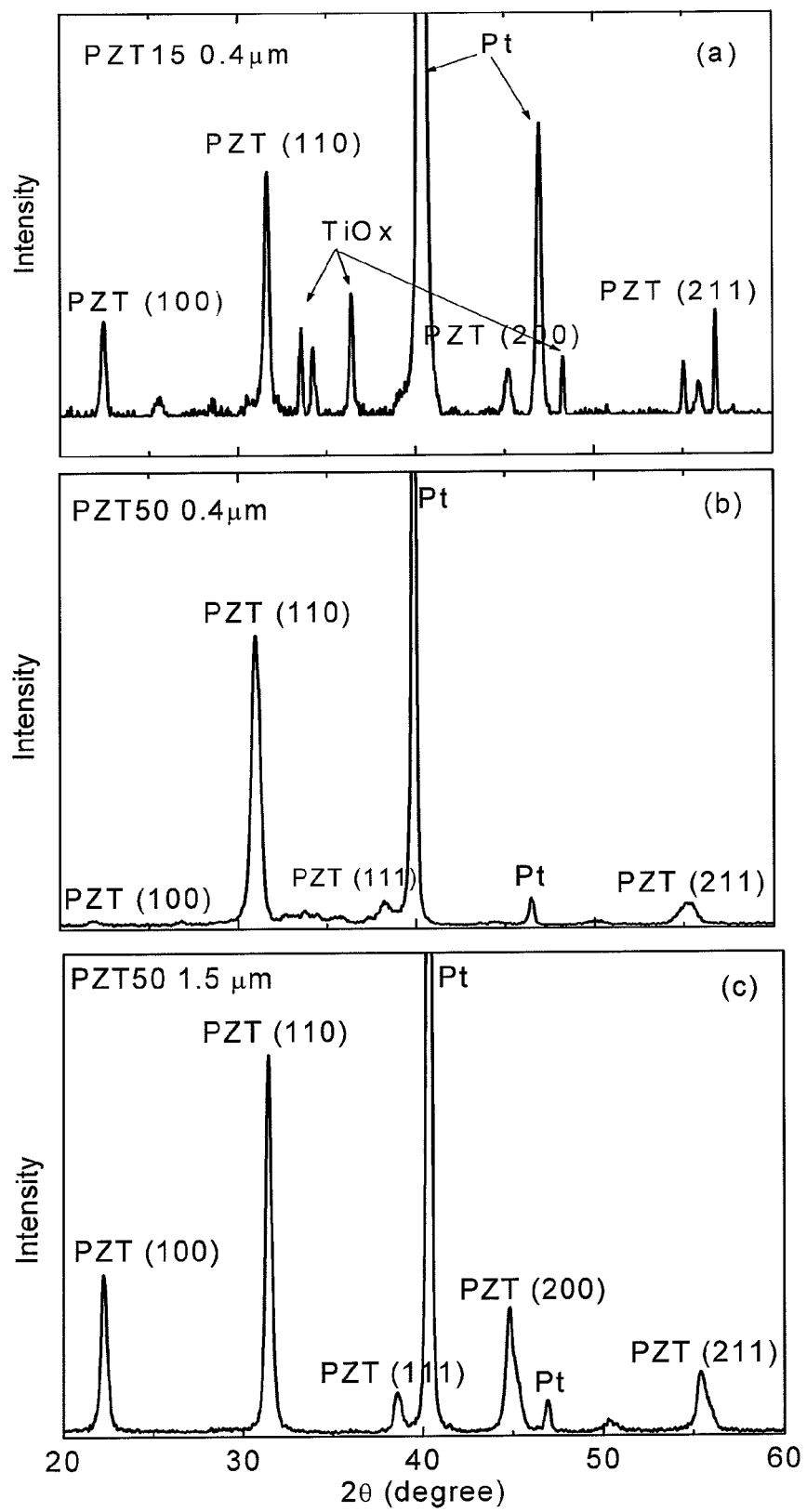
FIG. 2(a) shows the X-ray diffraction pattern of a PZT15 thin film.
FIG. 2(b) shows the X-ray diffraction pattern of a PZT50 thin film of 0.4 μm in thickness.
FIG. 2(c) shows the X-ray diffraction pattern of a PZT50 thin film of 1.5 μm in thickness.

FIGS. 2(*a*), 2(*b*) and 2(*c*) show the X-ray diffraction patterns of a PZT15 thin film and that of a PZT50 thin film, respectively. Both films of FIGS. 2(*a*) and 2(*b*) were 0.4 μm thick as determined from the SEM cross-section micrographs. As can be seen, the PZT50 film exhibited a single-phase perovskite PZT diffraction pattern while the PZT15 film exhibited additional impurity titanium oxide peaks. FIG. 2(*c*) shows the XRD pattern of a PZT50 thin films of 1.5 μm thick. Much stronger (100) and (200) peaks were observed because of the increase in thickness.

The capacitances of PZT15 and PZT50 films of various thicknesses were measured. With the known top electrode area, A, and film thickness, d, the apparent dielectric constant, $\epsilon_a$, was deduced from the measured capacitance C using the relationship $\epsilon_a = Cd/(\epsilon_0 A)$ where $\epsilon_0 = 8.85 \times 10^{-12}$ $C^2 N^{-1} m^{-2}$ was the permittivity of free space. In Table I, the obtained apparent dielectric constants of the PZT50 and PZT15 films of various thicknesses, d are listed. As can be seen, generally, $\epsilon_a$, increased with an increasing film thickness. In addition, for the same thickness, the $\epsilon_a$ of the PZT50 film was higher than that of the PZT15 film. The highest dielectric constant measured from the PZT50 films was 1600 from the 1.2 and 1.6 μm thick films. Clearly, both the lead content and the film thickness affected the apparent dielectric constant.

TABLE I

| | d (μm) | $\epsilon_a$ |
|---|---|---|
| PZT15 | 0.12 ± 0.01 | 360 ± 50 |
| | 0.16 ± 0.015 | 410 ± 60 |
| | 0.4 ± 0.020 | 590 ± 70 |
| PZT50 | 0.2 ± 0.015 | 650 ± 100 |
| | 0.4 ± 0.02 | 1100 ± 290 |
| | 0.6 ± 0.06 | 1060 ± 200 |
| | 0.7 ± 0.08 | 1430 ± 210 |
| | 0.9 ± 0.055 | 1700 ± 200 |
| | 1.2 ± 0.065 | 1580 ± 140 |
| | 1.6 ± 0.14 | 1650 ± 240 |

Figures 3A, 3B:
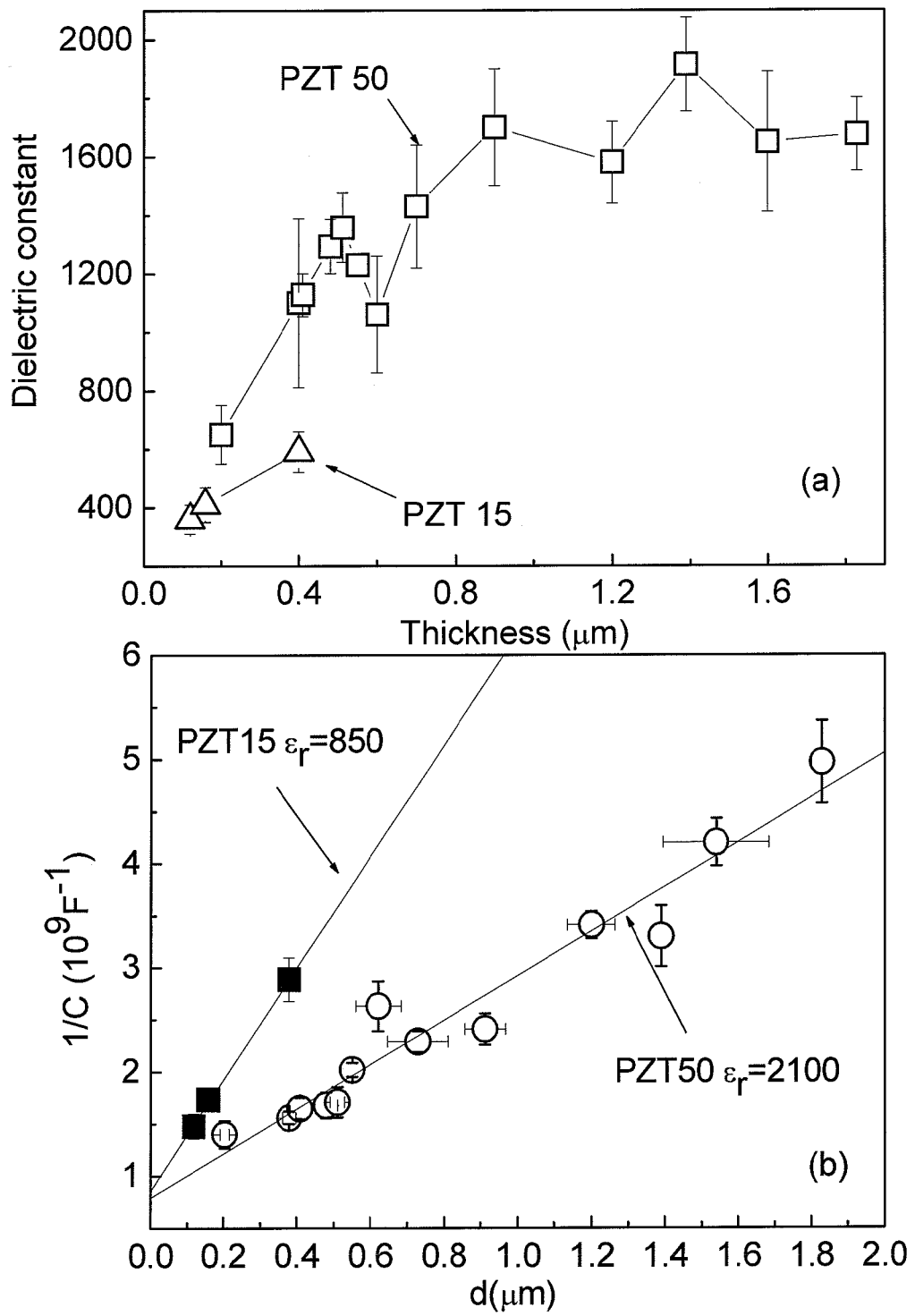
FIG. 3(a) shows a plot of the apparent dielectric constant versus d for the films of FIG. 1.
FIG. 3(b) shows a plot of the inverse capacitance, 1/C, versus d for the film of FIG. 1.

To examine how the thickness and the lead content affected the apparent dielectric constant, the apparent dielectric constant and the 1/C versus d are plotted in FIG. 3. Consider the PZT film as two capacitors in series: one due to the PZT film and the other the interfacial layers, the measured capacitance could then be related to the intrinsic dielectric constant of the PZT film, $\epsilon_i$, the dielectric constant of the interfacial layer(s), $\epsilon_{int}$, and the thickness of the interfacial layer(s), $d_{int}$ as $$\frac{1}{C} = \frac{d_{int}}{\epsilon_0 A}\left(\frac{1}{\epsilon_{int}} - \frac{1}{\epsilon_i}\right) + \frac{d}{\epsilon_0 \epsilon_i A}. \quad (1)$$

The slope of 1/C versus d plot yielded $1/(\epsilon_0 \epsilon_i A)$ where $\epsilon_0$ was the permittivity of the free space, and A the known area of the electrode. As can be seen, the PZT50 films exhibited a much higher intrinsic dielectric constant ($\epsilon_i = 2100$ at 10 kHz) than the PZT15 films ($\epsilon_i = 850$ at 10 kHz), consistent with the SEM observations that the PZT50 films were denser than the PZT15 films and the X-ray result that the PZT50 films were single-phase perovskite while the PZT15 films were not. Moreover, the 1/C versus d of both the PZT15 films and PZT50 films had the same y-axis intercept, indicating that both PZT15 and PZT50 films had the same interfacial capacitance. Assuming that the interfacial layer was $TiO_x$ (as evidenced in the X-ray pattern of the PZT15 film) and that $\epsilon_{int} = 80$, that of $TiO_2$, the deduced total thickness of the interfacial layer(s) was 16 nm. That both PZT15 and PZT50 films exhibited the same interfacial capacitance suggested that the present $Pt/TiO_x/SiO_2/Si$ substrate was thermally stable.

Figures 4A, 4B:
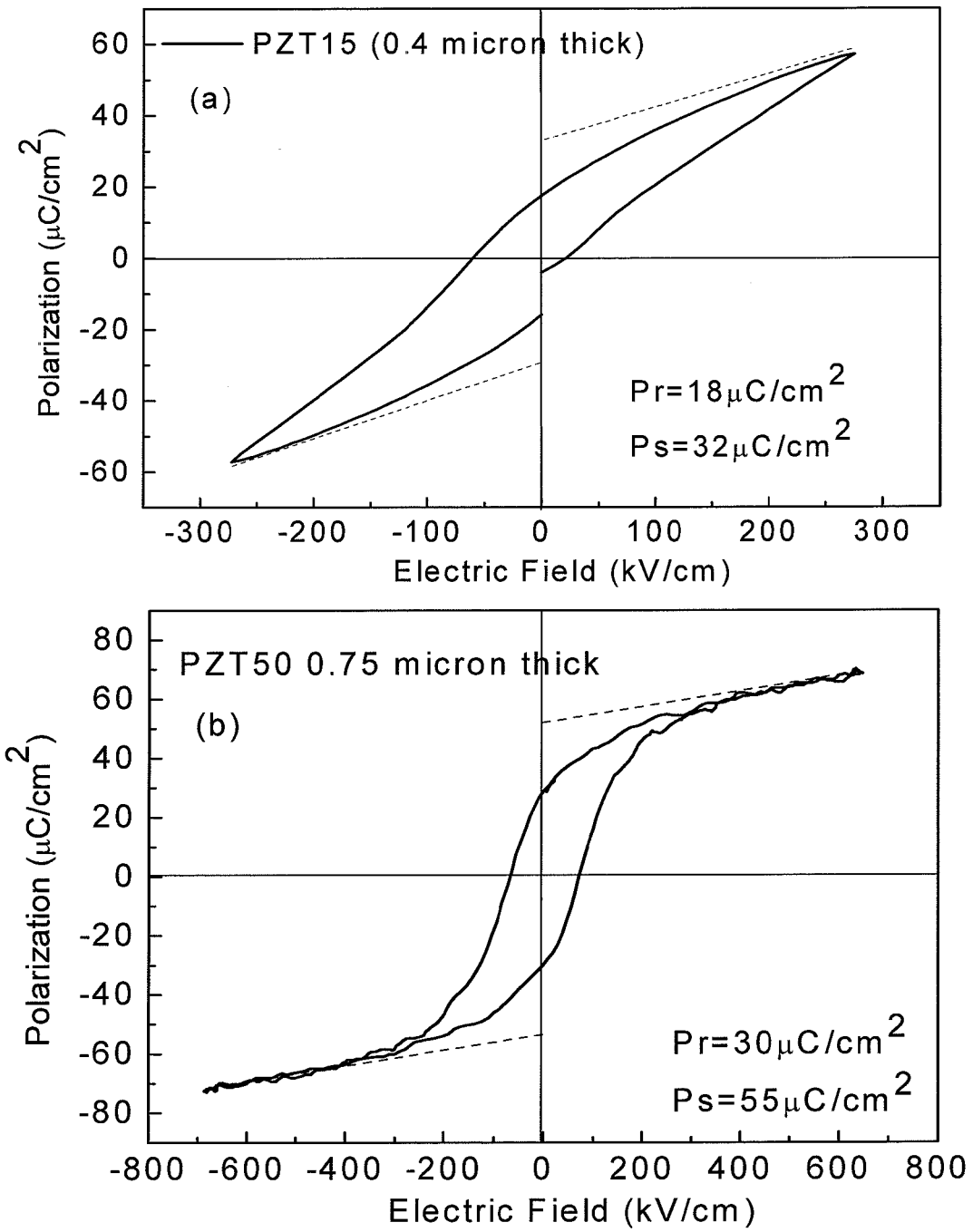
FIG. 4(a) shows a polarization versus electric field curve for a PZT15 film of 0.4 μm in thickness.
FIG. 4(b) shows a polarization versus electric field curve for a PZT50 film of 0.75 μm in thickness.

The polarization versus electric field curves of the PZT50 film of 0.75 μm in thickness and PZT15 film of 0.4 μm in thickness are respectively shown in FIGS. 4(*a*) and 4(*b*). As can be seen the PZT50 film had a higher saturation polarization, $P_s$, and a higher remnant polarization, $P_r$ ($P_s = 55$ μC/cm$^2$ and $P_r = 30$ μC/cm$^2$) than the PZT15 film ($P_s = 32$ μC/cm$^2$ and $P_r = 18$ μC/cm$^2$).

Figure 5A:
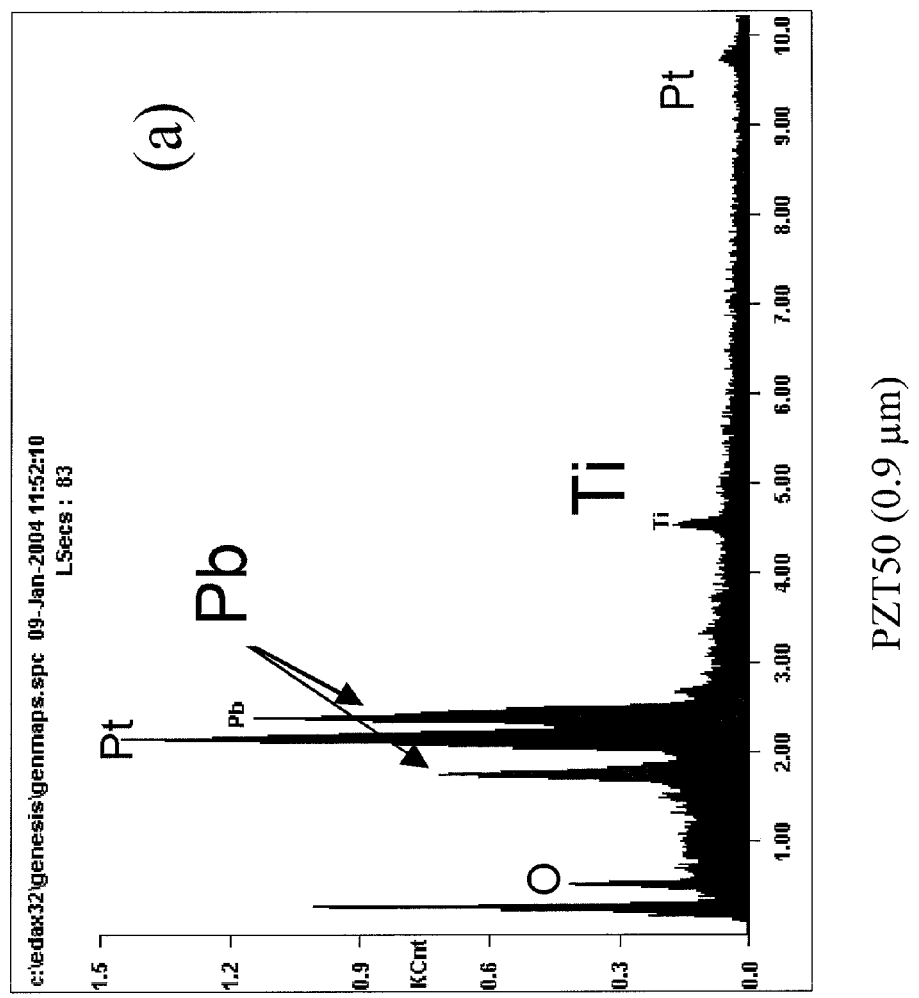
FIG. 5(a) shows the EDS spectrum of a 0.9 μm thick PZT50 film.
Figure 5B:
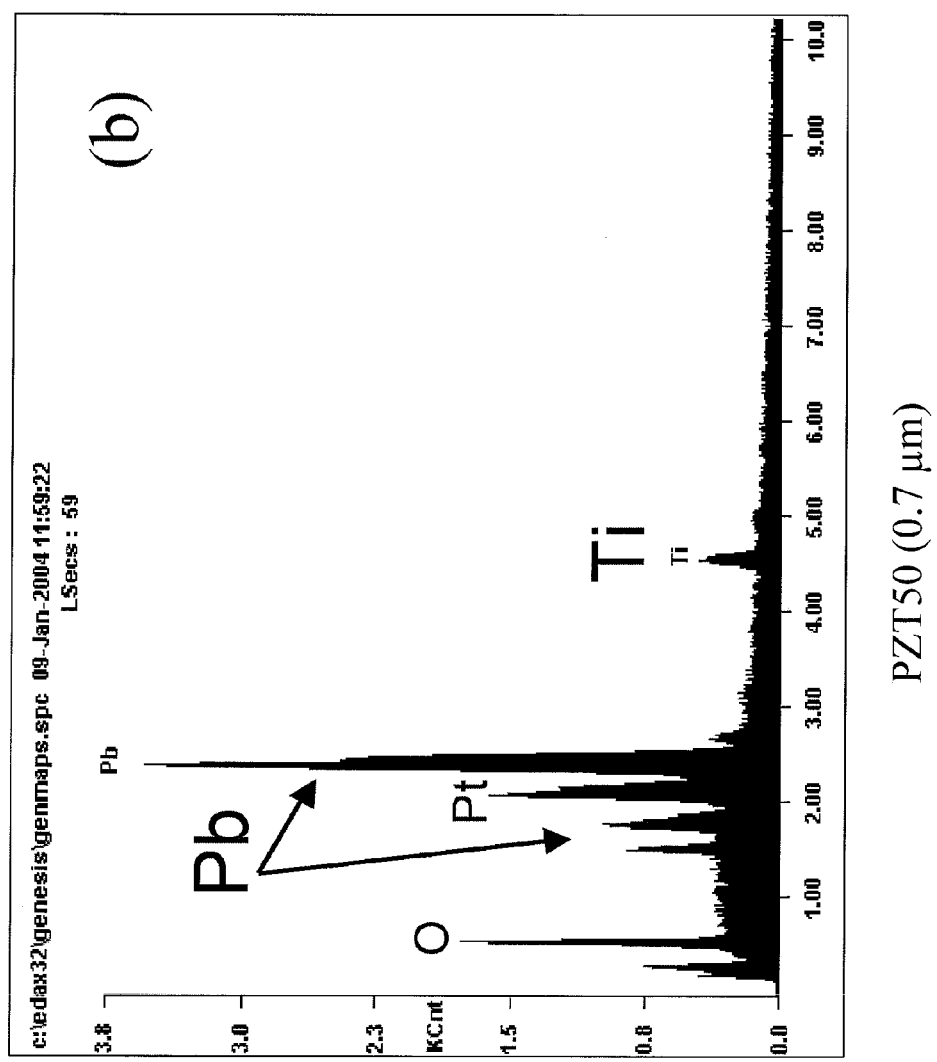
FIG. 5(b) shows the EDS spectrum of a 0.7 μm thick PZT50 film.
Figure 5C:
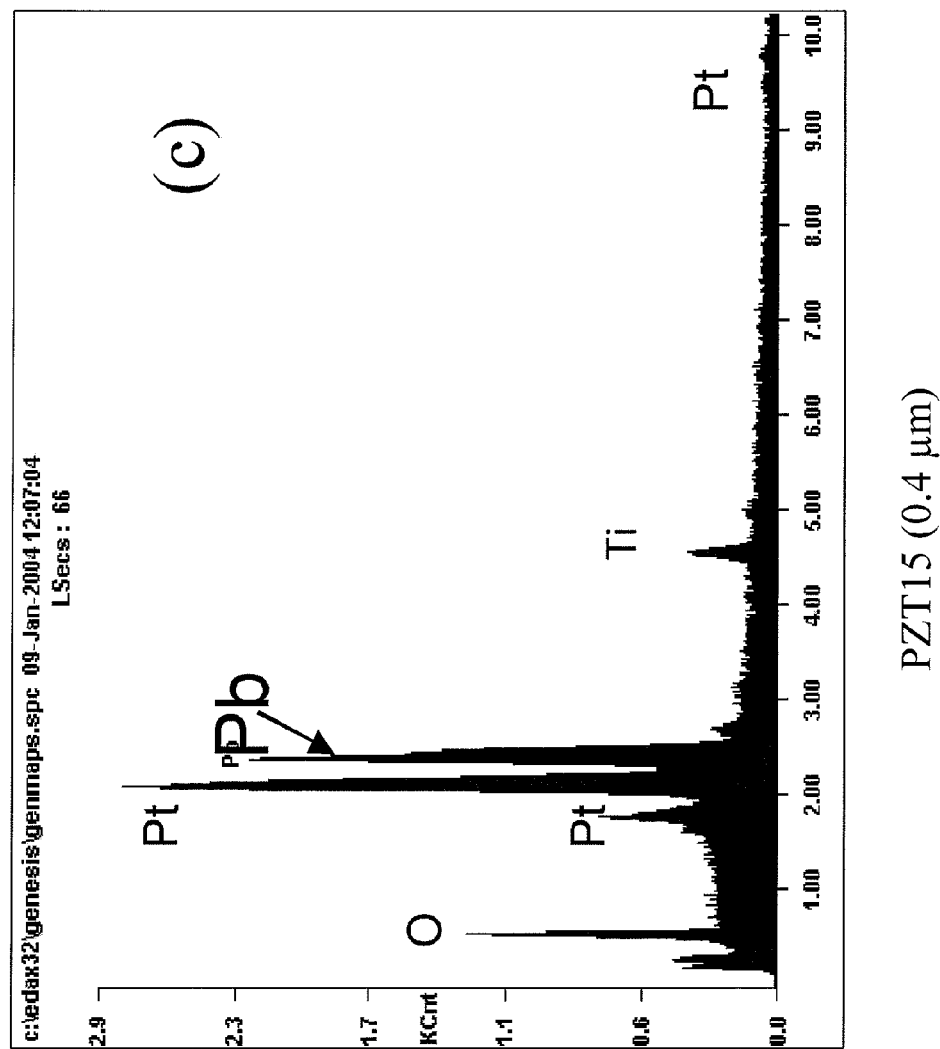
FIG. 5(c) shows the EDS spectrum of a 0.4 μm thick PZT15 film.

As can be seen from FIG. 5(*b*) the 0.75-μm thick PZT50 film could withstand 600 kV/cm, which was much higher than the typical maximum field of 200-400 kV/cm for most PZT films. The high maximum field that the PZT50 films could withstand was consistent with the SEM observations that the PZT50 films were denser than the PZT15 films. The higher $P_s$ and $P_r$ exhibited by the PZT50 film were also consistent with the result that the PZT50 was single-phase perovskite and that the PZT50 films had a higher apparent dielectric constant than PZT15 films of the same thickness.

Examples 3-4

Varying the Thickness of the PZT50 Film

The chemical compositions of the films were examined by EDS. The nominal Ti/Zr molar ratio was 47/53 and the nominal Pb/Ti molar ratio was 100/31 for the PZT50 films and 100/41 for the PZT15 films. The EDS spectrum of a 0.9 μm thick PZT50 film, that of a 0.7 μm thick PZT50 film and 0.4 μm thick PZT15 film are shown in FIGS. 5(*a*), 5(*b*), and 5(*c*), respectively. The Pb/Ti molar ratio of the PZT50 and PZT15 films as deduced from the EDS results shown in FIGS. 5(*a*)-5(*c*) are shown in Table II. Also listed in Table II is the theoretical Pb/Ti molar ratio, 100/47 of stoichiometric Pb(Zr$_{0.53}$Ti$_{0.47}$)O$_3$. The EDS analysis showed that PZT50 films of 0.9 μm and 0.7 μm in thickness had a Pb/Ti molar ratio of 100/46 and 100/43, respectively and the 0.4-μm thick PZT15 films exhibited a Pb/Ti molar ratio of 100/61. The reduced Pb/Ti molar ratio in the PZT15 film indicated lead deficiency, which was consistent with the observation of additional titanium oxide peaks in the X-ray pattern of the PZT15 film in FIG. 1(*a*). In comparison, the PZT50 films had a Pb/Ti molar ratio close to the Pb/Ti molar ratio, 100/47, of stoichiometric Pb(Zr$_{0.53}$Ti$_{0.47}$)O$_3$ with a slight lead excess, 2% excess for the 0.9 μm PZT50 film and 9% excess for the 0.7 μm PZT50 film.

TABLE II

Pb/Ti molar ratio of the PZT50 and PZT15 films as deduced from the EDS results

| | PZT50 (0.9 μm) | PZT50 (0.7 μm) | PZT15 (0.4 μm) | Theoretical |
|---|---|---|---|---|
| Pb/Ti molar ratio | 100/46 | 100/43 | 100/61 | 100/47 |

Example 5

Micro-Patterning the PZT50 Film

The PZT50 film was micro-patterned by Inductively Coupling Plasma (ICP). Because the present PZT50 films were dense and uniform, the etching rate was constant at 40 nm/min and the etching depth could be controlled precisely by the etching time. FIGS. 6(a) and 6(b) show the SEM micrograph of a partially-etched PZT50 surface and that of the platinum bottom electrode surface after etching. From FIG. 6(a), one can see that the etched PZT surface was smooth with an average grain size larger than 2 μm. From FIG. 6(b), one can see that a replica of the PZT grain pattern was etched in the platinum bottom electrode surface due to the different etching rates between the PZT grains and the PZT grain boundaries. A higher etching rate at the grain boundaries as a result of the lower density at the grain boundaries resulted in grooves in the platinum electrode that replicated the grain structure of the PZT film. That the PZT grain structure was replicated in the platinum surface indicated that the PZT film had a columnar grain structure in the thickness direction, consistent with the observation that the average grain size, 2 μm, was larger than the film thickness, 1.6 μm.

After the nickel protection mask was removed by Nickel Etchant TFB (Transene Company Inc., Danvers, Mass.) to expose the titanium/platinum top electrode, the dielectric constant of the micropatterned PZT50 film was then measured. The result showed the apparent dielectric constant of the patterned PZT50 film was 1500, close to the pre-patterning value, 1600, indicating that the ICP etching process caused minimal damage to the PZT film.

Example 6

Effect of Aging the Lead Acetate Anhydrous

Examples 1-5 were conducted with aged lead acetate anhydrous. When fresh lead acetate was used, the precursor solution was very clear and not viscous at all. An aging study was initiated to investigate the difference between the aged lead acetate and fresh lead acetate. Aging lead acetate in air made the precursor solution more viscous.

While not wishing to be bound by a particular theory, it appears that the aging process allows the adsorption of $CO_2$ into the lead acetate anhydrous powder, which forms a $PbCO_3$ compound that is not soluble in water, thereby making the precursor more viscous. On the other hand, the lead acetate anhydrous powder can also adsorb water. Slight water adsorption makes the precursor solution cloudier and does not change the precursor cross-linking capability or the final film quality. However, if the lead acetate adsorbs too much water, the precursor becomes very cloudy and could no longer be used.

Figure 8:
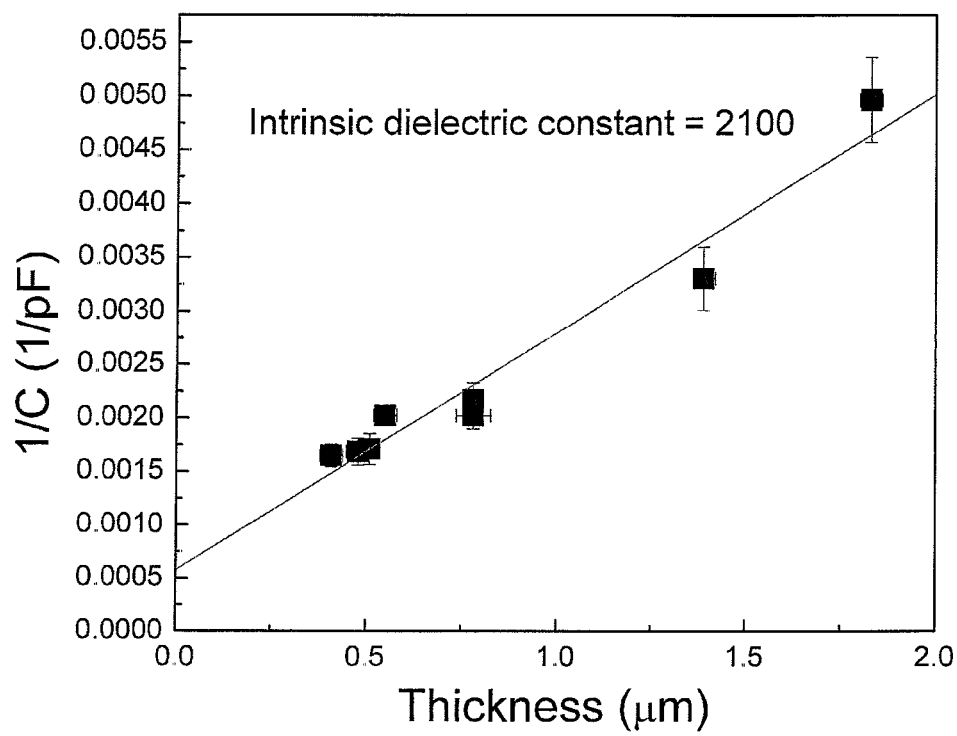
FIG. 8 is a plot of the inverse capacitance versus film thickness of the PZT film made with lead acetate aged for 19 days.

FIG. 7 shows an SEM micrograph of a cross-section of the PZT film made with lead acetate aged for 19 days. As can be seen the film was dense with periodic small pores. The resultant PZT film exhibited excellent dielectric properties. In Table III, the dielectric constants of PZT50 films of various thicknesses made with lead acetate anhydrous aged for 19-24 days are given. The inverse capacitance versus film thickness was plotted in FIG. 8. As can be seen, with the control of the lead acetate anhydrous aging, the properties of the PZT50 films were further improved with an apparent dielectric constant of 1900, and an intrinsic dielectric constant 2100.

TABLE III

Dielectric constant of PZT films with aged lead acetate of various film thicknesses

| Thickness(um) | Dielectric constants |
|---|---|
| 0.41 ± 0.03 | 1100 ± 70 |
| 0.48 ± 0.03 | 1300 ± 90 |
| 0.51 ± 0.02 | 1400 ± 120 |
| 0.55 ± 0.03 | 1200 ± 40 |
| 0.78 ± 0.05 | 1800 ± 100 |
| 0.78 ± 0.01 | 1600 ± 110 |
| 1.39 ± 0.03 | 1900 ± 160 |
| 1.83 ± 0.03 | 1700 ± 130 |

Example 7

Turbidity of Precursors

Figure 9:
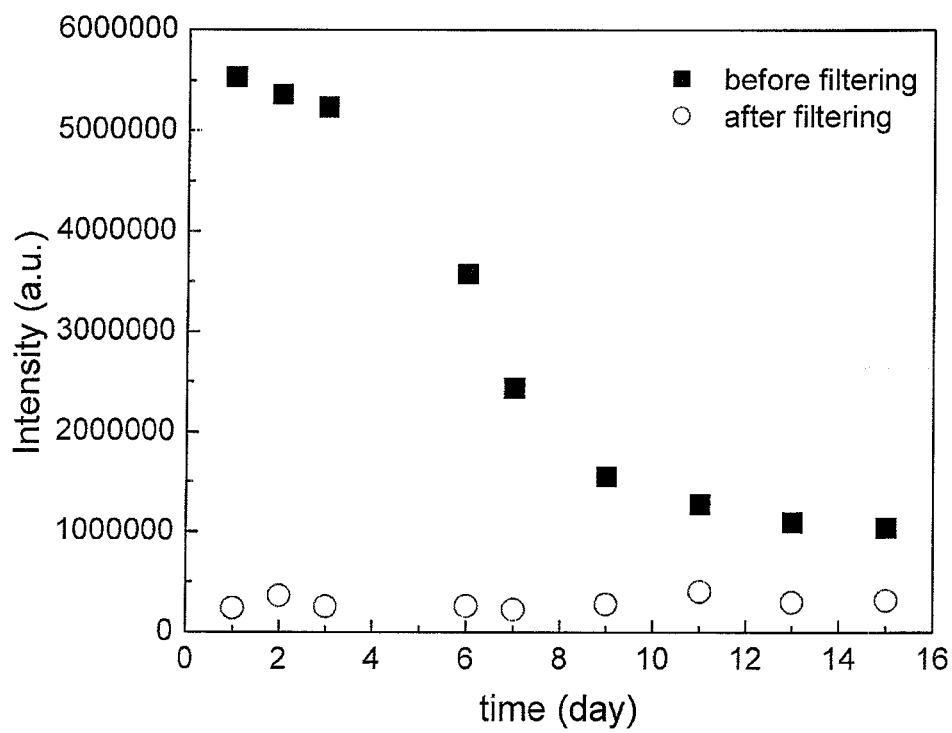
FIG. 9 shows the light scattering behavior for a precursor of the invention as a function of time, before and after filtering.

The turbidity of the precursors was characterized by measuring the intensity of the scattered light at 90° with the incident light that had a wavelength of 800 nm using a spectrofluorometer. The results show that the precursor that produces good PZT films has the characteristics of a decreasing intensity of scattered light with time before filtering and a constant intensity of scattered light after filtering. Precursors resulting in a changing intensity light scattering after filtering give poor PZT films. FIG. 9 shows the behavior of light intensity of a good precursor as a function of time before and after filtering.

Example 8

Fabrication of Piezoelectric Microcantilevers

A microfabrication procedure for a $PZT/SiO_2$ piezoelectric microcantilever sensors is schematically shown in FIG. 10. A 2-μm thick low-stress $SiO_2$ layer was deposited on both side of a (100)-oriented silicon wafer by steam oxidation at 800° C. The front-side $SiO_2$ works as the non-piezoelectric layer of the microcantilever and the back-side $SiO_2$ as the etching mask for the backside KOH wet etching of the silicon.

A 400 Å thick $TiO_2$ bonding layer was deposited by reactive sputtering of Ti followed by the deposition of the 1500 Å-thick platinum bottom electrode. Reactive sputtering of Ti was carried out at 15 mTorr of 80% oxygen and 20% helium. The stage was heated up to 650° C. at a rate of 5° C./min. The RF power was adjusted according to the expected deposition rate. After deposition, the stage was cooled to room temperature at a rate of 5° C./min to avoid residual stress. The platinum bottom electrode sputtering was started when the stage reached room temperature. 1500 Å is the desired thickness for the platinum bottom electrode.

On the $Pt/TiO_2/SiO_2/Si$ substrate a 1.5-μm thick PZT layer was deposited by the sol-gel method discussed above with repeated spin coatings and heat treatments. The combination of the $TiO_2$ buffer and a $SiO_2$ under-layer larger than 0.5 μm thick effectively eliminated the inter-diffusion between the PZT layer and the substrate to provide high-quality PZT films.

On the PZT layer, a top electrode, Pt/Ti or Au/Cr, was deposited by E-gun evaporation in high vacuum ($2 \times 10^{-6}$ torr or lower) to avoid oxidation of the metal, especially the Cr layer. E-gun evaporation was chosen because it is gentler than sputtering or thermal evaporation to avoid damage to the PZT layer. The thickness of bonding layer (Ti or Cr) is 5-40 nm thick and the electrode layer (Pt or Au) is 100-200 nm thick. A nickel layer was deposited on the top electrode as hard mask to protect the top electrode and the PZT underneath it during the PZT dry etching. The Ni and the top electrode were patterned by an over-hang lift-off process. The thickness of undercut photoresist (LOR) is 1.5 times that of the metal layer, about 0.8 to 1.2 µm. LOR10B and SPR3012 photoresists were recommended for this overhang lift-off process. The selectivity (etching rate) ratio of PZT to Ni was nearly 5:1. The thickness of Ni should be about 0.3-0.5 µm depending on the PZT thickness.

The exposed PZT and the $TiO_2$/Pt bottom electrode were patterned by a chlorine-based inductively coupled plasma (ICP) dry etching process. The etching gas was chlorine and the flow rate 150 sccm. The pressure of the etching chamber should be below 10 mTorr. The RF power was adjusted according to the etching rate. Since the PZT is a ceramic material and the etching mask nickel is stable at high temperatures, a high RF power around 400 W is recommended for the PZT dry etching process. The selectivity ratios of the PZT dry etching process are 5:1 for Ni and 8:1 for Pt. The etching mask for the bottom electrode was a thick photoresist (PR) such as one in the SPR220 series. Because the etching mask was a photoresist, a low RF power is recommended for this etching process. A silver glue was used to fill in between the sample and the stage to help dissipate the heat during etching. A 20-min cooling step is needed after every 5 min of etching. If the etching temperature is kept below 120° C., the PR can be removed easily by acetone after etching.

The silicon dioxide on the back side was patterned by photolithography and the exposed silicon dioxide was etched by $CF_4$/$CHF_3$ based reactive ion etching (RIE). When silicon-dioxide etching was finished, the whole front side was sealed with black wax, and the sample was placed in a 45% potassium hydroxide (KOH) solution. The temperature of the solution was controlled to be at about 55-60° C. and the KOH etched the exposed silicon with the remaining silicon dioxide as the etching mask.

When silicon deep etching was finished, the black wax was dissolved with trichloroethylene (TCE) and the front side was cleaned. The exposed silicon dioxide on the front side was removed by a $CF_4$/$CHF_3$-based reactive ion etching (RIE). The top electrode and bottom electrode can work as the mask and the selectivity ratios are very high. The etching time can be a little longer to make sure all silicon dioxide is removed and the cantilevers are released.

After acetone, 2-proponal and DI water rinse cleaning, free standing PZT/$SiO_2$ piezoelectric microcantilever sensors were obtained.

Having described the preferred embodiments of the invention which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, the intended scope of protection is set forth in the appended claims.

What is claimed is:

1. A method for producing a lead-containing perovskite film comprising the steps of:
   (a) dissolving lead acetate and other film components in a suitable solvent to provide a precursor solution,
   (b) depositing the precursor on a substrate;
   (c) pyrolyzing the deposited precursor;
   (d) annealing the pyrolyzed precursor; and
   (e) repeating steps (b)-(d) to obtain a desired film thickness, wherein sufficient lead is employed in step (a) to provide a 25-75 mole percent stoichiometric excess of lead, relative to a stoichiometric amount of lead required to react with said other film components for form said perovskite film, wherein the lead acetate comprises lead acetate anhydrous, and
   wherein the lead acetate anhydrous is aged in air for 19 to 24 days.

2. A method for producing a lead-containing perovskite film comprising the steps of:
   (a) dissolving lead acetate and other film components in a suitable solvent to provide a precursor solution,
   (b) depositing the precursor on a substrate;
   (c) pyrolyzing the deposited precursor;
   (d) annealing the pyrolyzed precursor; and
   (e) repeating steps (b)-(d) to obtain a desired film thickness, wherein sufficient lead is employed in step (a) to provide a 25-75 mole percent stoichiometric excess of lead, relative to a stoichiometric amount of lead required to react with said other film components for form said perovskite film,
   further comprising the step of reactive sputtering to deposit the titanium oxide on the silicon dioxide,
   wherein said substrate comprises Pt/$TiO_x$/$SiO_2$/Si,
   wherein thermally stable titanium oxide is employed as an adhesion layer between a platinum electrode and a silicon dioxide layer, and
   wherein the substrate temperature during said reactive sputtering step is 550-750° C.

* * * * *